US006518653B1

(12) United States Patent
Takagi

(10) Patent No.: US 6,518,653 B1
(45) Date of Patent: Feb. 11, 2003

(54) LEAD FRAME AND SEMICONDUCTOR DEVICE

(75) Inventor: Saeko Takagi, Oita (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/328,260

(22) Filed: Jun. 10, 1999

(30) Foreign Application Priority Data

Jun. 15, 1998 (JP) .............................. 10-166441

(51) Int. Cl.⁷ .............................................. H01L 23/48
(52) U.S. Cl. ....................................... 257/677; 257/666
(58) Field of Search ................................ 257/666, 677, 257/690, 782, 783

(56) References Cited

U.S. PATENT DOCUMENTS

| 4,141,029 A | * | 2/1979 | Dromsky | 357/70 |
| 4,673,967 A | * | 6/1987 | Hingorany | 357/70 |
| 4,707,724 A | * | 11/1987 | Suzuki et al. | 357/71 |
| 4,888,449 A | * | 12/1989 | Crane et al. | 174/52.4 |
| 5,329,158 A | * | 7/1994 | Lin | 257/666 |
| 5,343,073 A | * | 8/1994 | Parthasarathi et al. | 257/666 |
| 5,360,991 A | * | 11/1994 | Abys et al. | 257/666 |
| 5,486,721 A | * | 1/1996 | Herklotz et al. | 257/666 |
| 5,635,755 A | * | 6/1997 | Kinghorn | 257/666 |
| 5,844,305 A | * | 12/1998 | Shin et al. | 257/676 |
| 6,034,422 A | * | 3/2000 | Horita et al. | 257/677 |

* cited by examiner

Primary Examiner—Jerome Jackson
Assistant Examiner—Lourdes Cruz
(74) Attorney, Agent, or Firm—Rader, Fishman & Grauer PLLC; Ronald P. Kananen, Esq.

(57) ABSTRACT

A lead frame comprising a plurality of leads and a die pad disposed at a position surrounded by top ends on one side of the leads, wherein at least the outermost layer on the obverse of the die pad comprises a nickel plated layer, as well as a semiconductor device comprising the lead frame and a semiconductor element mounted by way of a bonding agent on the nickel plated layer at the obverse of the die pad.

9 Claims, 3 Drawing Sheets

FIG. IA
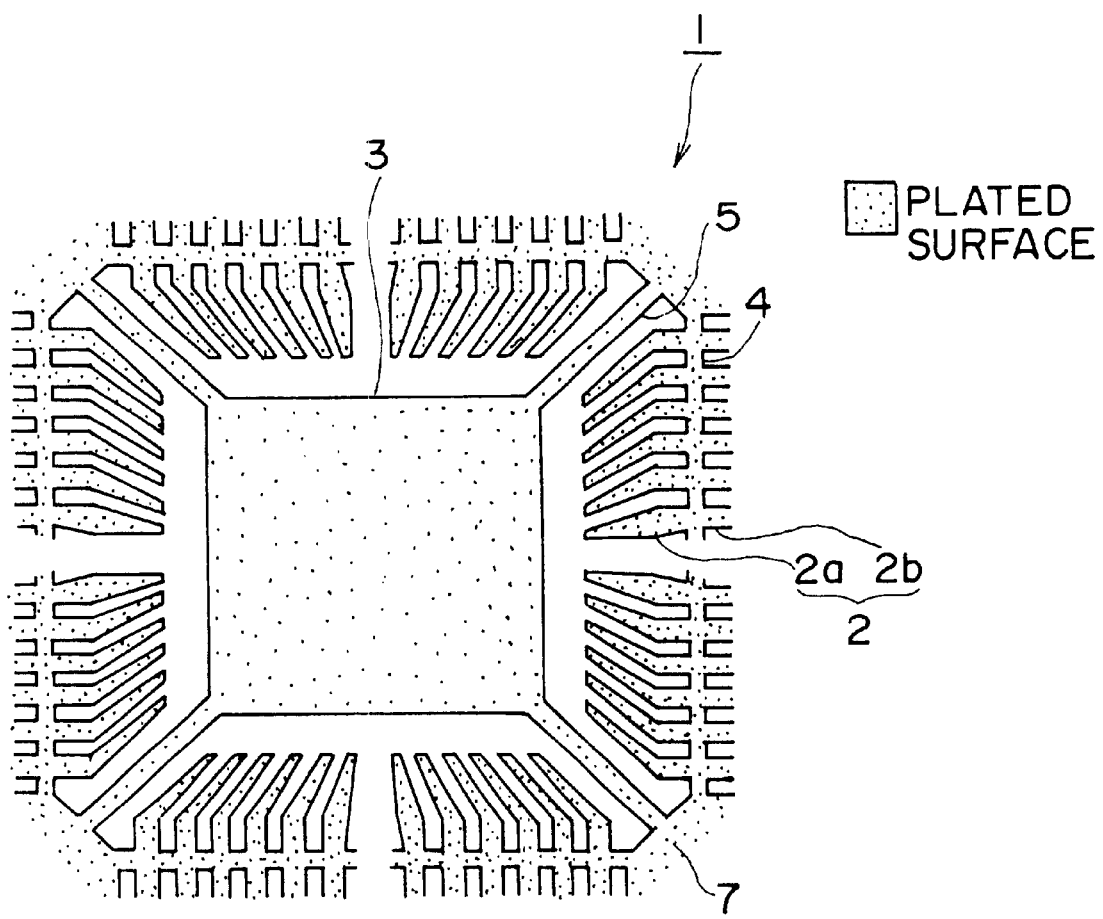
FIG. IB
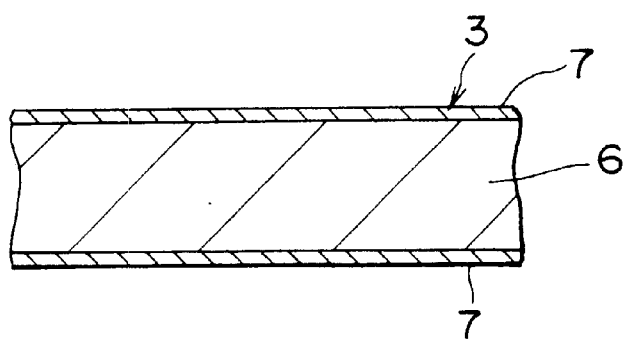

LEAD FRAME AND SEMICONDUCTOR DEVICE

BACKGROUND OF THE INVENTION

1. Field of the Invention

The present invention relates to a lead frame and a semiconductor device, and more particularly to a lead frame used for a resin-encapsulated type semiconductor device and a resin-encapsulated type semiconductor device.

2. Description of the Related Art

Heretofore, a resin-encapsulated semiconductor device or semiconductor package comprises, as shown in FIG. 4, a lead frame 50 having a plurality of leads 51 and a die pad 52 disposed at a position surrounded by top ends of the leads 51, a semiconductor element 54 mounted by way of a bonding agent 53 on the obverse of the die pad 52 and an encapsulation portion 55 for integrally resin-encapsulating the semiconductor element 54, the top ends of the leads 51 and the die pad 52.

Most of the lead frame 50 equipped with the semiconductor device is formed at present with an iron-42% nickel material (hereinafter simply referred to as a 42-alloy material) or a material mainly composed of copper (hereinafter simply referred to as a copper material), and development has proceeded for the copper material in view of its high heat conductivity, low cost and good workability.

However, in a lead frame made of a copper material, since oxide layers composed of copper oxides ($CuO$ and $Cu_2O$) are formed on the obverse and the reverse of the die pad after fabrication to worsen the adhesion between the bonding agent comprising, for example, an epoxy resin type silver paste and the obverse of the die pad and the adhesion between the encapsulating resin material and the reverse of the die pad. Therefore, a semiconductor device manufactured by using a lead frame made of the copper material involves a problem that cracks 56 are liable to be formed in the encapsulation portion as shown in FIG. 4 upon mounting the device by reflow to a substrate in a moistened state of the encapsulation portion to deteriorate cracking resistance, compared with a semiconductor device manufactured by using a lead frame made of the 42 alloy material.

That is, since the encapsulating resin is highly hygroscopic and the encapsulation portion of the semiconductor device is in a moistened state upon mounting, steam evolves in the encapsulation portion by high temperature during reflow. As a result, peeling occurs easily by the generation of steam at a boundary between the bonding agent and the die pad and at a boundary between the encapsulating resin material and the reverse of the die pad where the adhesion is poor and, further, cracks are caused in the encapsulation portion by the stresses formed by the expansion of the steams in the peeled portion.

SUMMARY OF THE INVENTION

The foregoing problem can be solved. according to the present invention by a lead frame comprising a plurality of leads and a die pad which are formed by using a copper material wherein, in the leads and the die pad, at least the obverse and the reverse of the die pad comprise a nickel plated surface.

The present invention also provides a semiconductor device comprising the lead frame as described above, a semiconductor element mounted by way of a bonding agent to the obverse of the die pad and a resin encapsulation portion for integrally resin-encapsulating the semiconductor element and the top ends of the leads.

The plated nickel has higher adhesion with a bonding agent such as a silver paste and a resin-encapsulating material, compared with copper oxides and, particularly, nickel oxide formed by oxidation of plated nickel has a good adhesion with the encapsulating resin material. Furthermore, the nickel plated surface has excellent adhesion with a solder used upon mounting.

In the lead frame according to the present invention, since at least the obverse and the reverse of the die pad comprises such a nickel plated surface, a higher adhesion strength is obtained between the obverse of the die pad and the bonding agent upon mounting the semiconductor element to the obverse of the die pad by way of the bonding agent. In addition, a high adhesion strength can be obtained between the reverse of the die pad and the encapsulating resin compared with the prior art in which copper oxides were formed to the obverse and the reverse of the die pad when the semiconductor element mounted on the obverse of the die pad and the top end of the lead are resin-encapsulated. Further, when plated nickel at the reverse of the die pad is oxidized by being exposed to air during resin encapsulation, the reverse of the die pad and the encapsulating resin are adhered more strongly. Furthermore, when the leads are also formed with the nickel plated surface together with the die pad, high adhesion can be obtained between the leads and the solder when the semiconductor device constituted by using the lead frame is mounted on a substrate by means of solder.

In the semiconductor device according to the present invention, since the lead frame as described above of the present invention is used, the reverse of the die pad and the encapsulating resin are more strongly adhered compared with the semiconductor device of the prior art constituted by using the lead frame only consisting of the copper material. Further, together with the die pad, if the leads are also formed with the nickel plated surface, the leads can be soldered with good adhesion upon mounting the semiconductor device to the substrate by using a solder.

DESCRIPTION OF THE ACCOMPANYING DRAWINGS

FIGS. 1A and 1B are views for explaining a preferred embodiment of a lead frame according to the present invention in which FIG. 1A is a plan view for a main portion and FIG. 1B is an enlarged cross sectional view for a portion of FIG. 1A;

DETAILED DESCRIPTION OF THE PREFERRED EMBODIMENTS

Figure 2:
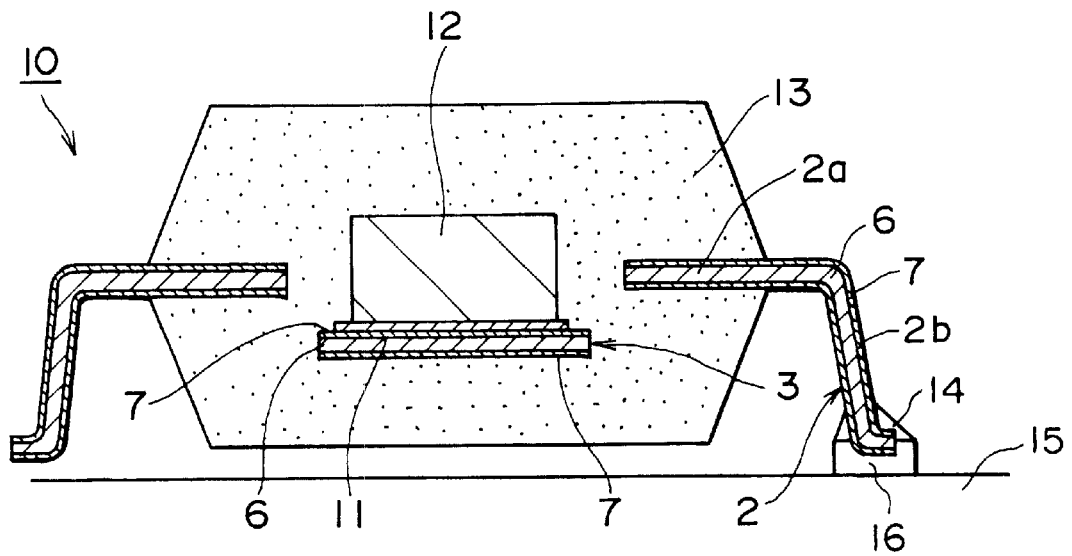
FIG. 2 is a cross sectional view showing a preferred embodiment of a semiconductor device according to the present invention.

Preferred embodiments of a lead frame and a semiconductor device according to the present invention are to be explained with reference to the accompanying drawings.

FIG. 1 is a view for explaining a preferred embodiment of a lead frame according to the present invention in which FIG. 1A is a plan view for a main portion and FIG. 1B is an enlarged cross sectional view for a portion of FIG. 1A.

As shown in FIG. 1, the lead frame comprises a plurality of leads 2 and a die pad 3 disposed at a position surrounded by top ends of the leads 2.

Each of the leads 2 comprises an inner lead 2a at the top end and an outer lead 2b extending outwardly from the rear end of the inner lead 2a, and each of the inner leads 2a is connected with a tie bar 4. The die pad 3 is of a substantially rectangular shape in a plan view, and supported by suspension leads 5 extended from four corners thereof to a frame main body (not illustrated).

The lead frame described above is made of a copper material 6. In this embodiment, the entire surface of the lead frame 1, that is, the obverse and the reverse of the leads 2, the die pad 3, the tie bar 4 and the suspension leads 5 are constituted as a nickel plated surface 7 formed by applying nickel plating to the copper material 6.

Then, a method of manufacturing a semiconductor device including the lead frame 1 described above (i.e., semiconductor package) is to be explained with reference to FIG. 2. At first, a frame made of an elongate copper material 6 as a base is applied with a shaping fabrication, for example, by etching or press punching to form the leads 2, the die pad 3, the tie bar 4 and the suspension leads 5 described above. Subsequently, nickel plating is applied to the obverse and the reverse of the fabricated copper material 6 to obtain a lead frame 1 in which the entire surface is formed with a nickel plated surface 7.

Then, a bonding agent 11 such as an epoxy resin type silver paste is coated on the obverse of the die pad 3, on which a semiconductor element 12 is mounted and the bonding agent 11 is cured by heating to fix the semiconductor element 12. Since the nickel plating has good adhesion with the bonding agent such as the silver paste compared with existent copper oxides, a stronger adhesion strength than usual can be obtained between the obverse of the die pad 3 formed as the nickel plated surface 7 and the bonding agent 11. Successively, electrodes of the semiconductor element 12 mounted on the obverse of the die pad 2 and the top ends of the inner leads 2a are electrically connected with wires made of gold or aluminum (not illustrated).

Subsequently, the inner leads 2a at the top ends of the leads 2, the die pad 3 and the semiconductor element 12 are integrally resin-encapsulated to form an encapsulation portion 13 using an encapsulating technique such as transfer molding. As the encapsulating resin material, a biphenyl resin or an epoxy resin used generally can be used for instance. In this case, since the reverse of the die pad 2 is also formed as the nickel plated surface 7, the reverse of the die pad 2 and the encapsulating resin material are bonded more strongly than usual. Further, since the nickel plated surface 7 at the reverse of the die pad 2 is oxidized being exposed to air until resin encapsulation, a stronger adhesion strength can be obtained between the reverse of the die pad 2 and the encapsulating resin material. With the steps described above, a semiconductor device 10 as an embodiment of the present invention shown in FIG. 2 comprising the lead frame 1, the semiconductor element 12 and the encapsulation portion 13 is manufactured.

In the semiconductor device 10 manufactured as described above, since the bonding agent 11 and the resin-encapsulating agent for the encapsulation portion 13 are strongly adhered to the obverse and the reverse of the die pad 3, the peeling strength is improved at each of the boundaries. Accordingly, in a solder reflowing step of mounting the device to a substrate, it is possible to effectively prevent boundary peeling at the obverse and the reverse of the die pad 3 and corresponding occurrence of cracks in the encapsulation portion, so that cracking proofness comparable with that of a semiconductor device using a lead frame made of 42-alloy can be ensured. Further, since the nickel plated surface 7 is also formed to the obverse and the reverse of the leads 2, the outer leads 2b of the leads 2 can be soldered to the electrodes 16 on the substrate 15 by means of solder 14 with good adhesion as shown in FIG. 2. In addition, since each of the leads 2 comprises the copper material of good bending workability, they can be fabricated into a desired shape satisfactorily.

Figure 3:
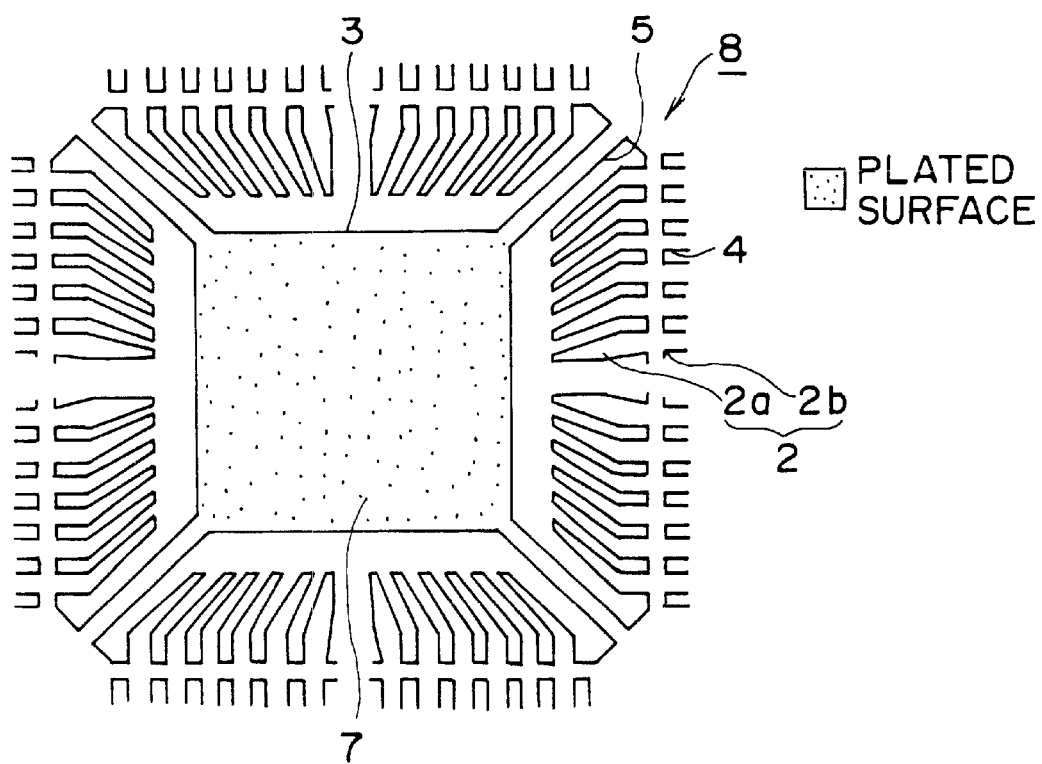
FIG. 3 is a plan view for a main portion illustrating another embodiment of a lead frame according to the present invention.
Figure 4:
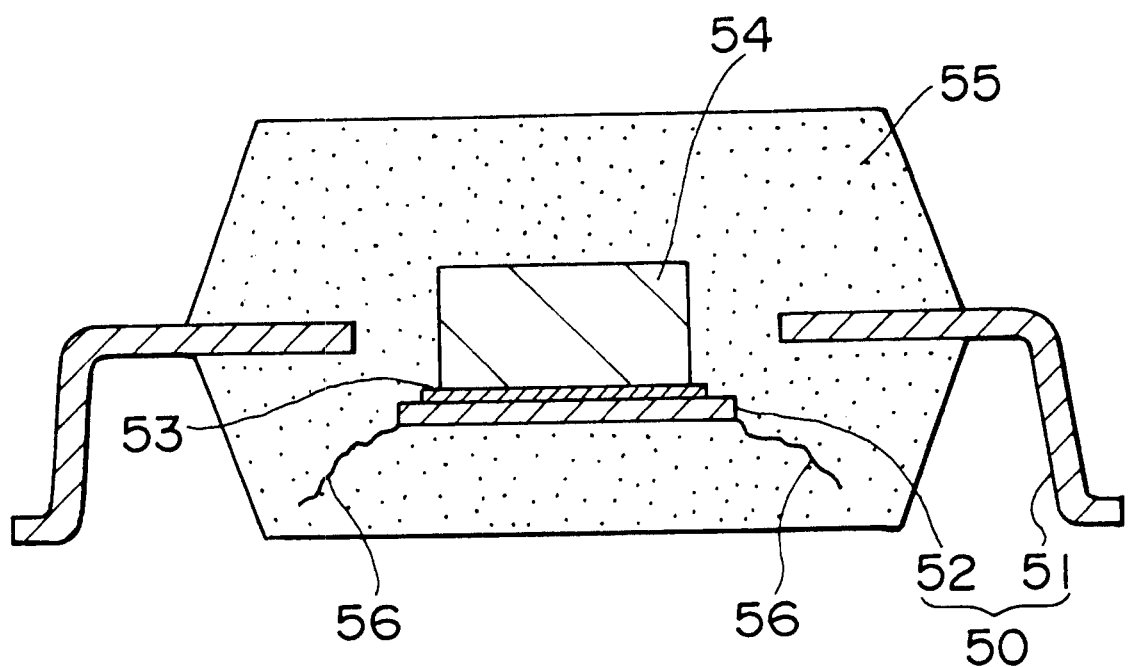
FIG. 4 is a cross sectional view showing an embodiment of a semiconductor device of the prior art.

In the foregoing embodiment, explanations have been made for an example in which the entire surface of the lead frame 1 is formed with the nickel plated surface 7, but the invention is not restricted to such an example. For example, as shown in FIG. 3 as the plan view for a main portion, only the obverse and the reverse of the die pad 3 may be formed with the nickel plated surface 7 in a lead frame 8. Further, a semiconductor device may be adapted to have a lead frame 8.

Also in the lead frame 8 described above, the bonding agent 11 and the resin-encapsulating agent for the encapsulation portion 13 can be adhered firmly to the obverse and the reverse of the die pad 3 to improve the peeling strength at each of the boundaries. Then, by the use of the lead frame 8, a semiconductor device with improved cracking proofness upon solder reflow for mounting the device to a substrate can be attained.

According to the lead frame of the present invention as described above, since at least the obverse and the reverse of the die pad comprises the nickel plated surface, a strong adhesion strength can be obtained between the obverse of the die pad and the bonding agent upon mounting the semiconductor element to the obverse of the die pad by way of the bonding agent, compared with the case of the prior art in which copper oxides were formed to the obverse and the reverse of the die pad, and a high adhesion strength can be obtained between the obverse and the reverse of the die pad, and the encapsulating resin upon resin-encapsulation. Accordingly, when a semiconductor device is constituted by using the lead frame according to the present invention, it is possible to prevent occurrence of cracks attributable to the adhesion between the obverse of the die pad and the bonding agent, and the adhesion between the reverse of the die pad and the encapsulating resin during reflow for mounting the device to the substrate.

Furthermore, according to the semiconductor device of the present invention, since the stronger adhesion is formed between the obverse of the die pad and the bonding agent and between the reverse of the die pad and the encapsulating resin by using the lead frame of the present invention described above, compared with the conventional semiconductor device constituted with the lead frame only made of a copper material, it is possible to obtain a semiconductor device with improved cracking proofness upon reflow for mounting the device to a substrate.

What is claimed is:
1. A lead frame comprising:
   a plurality of leads;
   a tie bar, connecting each of said leads;
   a die pad having an outermost layer, disposed at a position surrounded by top ends on one side of the leads, at least a part of the outermost layer of the die pad comprising a nickel plated layer; and
   suspension leads that support said die pad to a frame,
   wherein at least a portion of an outermost layer of said leads, said tie bar, said die pad, and said suspension leads comprises a nickel plated layer, and wherein the outermost layer on an obverse side of said die pad comprises a nickel plated layer, and the outermost layer on a reverse side of said die pad comprises a nickel plated layer.

2. A lead frame as claimed on claim 1, wherein an outermost layer at top ends on another side of said leads comprises a nickel plated layer at a portion that is adhered to a substrate by means of a solder.

3. A lead frame as claimed in claim 1, wherein the lead frame comprises a copper material.

4. A semiconductor device comprising:

a lead frame comprising a plurality of leads, a tie bar connecting each of the leads, a die pad disposed at a position surrounded by top ends on one side of the leads, and suspension leads that support said die pad to a frame, wherein at least a part of the outermost layer of the leads, the die pad, the tie bar, and the suspension leads comprises a nickel plated layer; and a semiconductor element mounted by way of a bonding agent on said die pad, said bonding agent being a silver paste and establishing an interface between said semiconductor element and said nickel plated layer of said die pad, wherein an outermost layer at top ends on another side of said leads comprises a nickel plated layer at a portion that is adhered to a substrate by means of a solder, and wherein the outmost layer on an obverse of said die pad comprises a nickel plated layer, and the outermost layer at a reverse side of said die pad comprises a nickel plated layer.

5. A semiconductor device as claimed in claim 4, wherein said semiconductor element is mounted by way of said bonding agent on the nickel plated obverse side layer of said die pad.

6. A semiconductor device as claimed in claim 4, wherein said bonding agent is a silver paste.

7. A semiconductor device as claimed in claim 4, wherein the outermost layer at top ends on another side of said leads comprises a nickel plated layer.

8. A semiconductor device as claimed in claim 4, wherein the device has an encapsulation portion for integrally resin-encapsulating said die pad, the semiconductor element and the top ends on one side of said leads.

9. A semiconductor device as claimed in claim 8, wherein nickel oxide is formed on said nickel plated layer of said die pad in said resin encapsulation portion.

* * * * *